United States Patent [19]
Reddy et al.

[11] Patent Number: 4,924,350
[45] Date of Patent: May 8, 1990

[54] RETENTION CLIP FOR A THERMAL PROTECTION SENSOR

[75] Inventors: Gaddam P. Reddy, Jackson, Miss.; Robert A. Kulka, Livington; Gregory P. Goring, Cedar Grove, both of N.J.; Raymond H. Van Wagener, Darien, Conn.

[73] Assignee: Magnetek Universal MFG, Corporation, Paterson, N.J.

[21] Appl. No.: 194,744

[22] Filed: May 17, 1988

[51] Int. Cl.[5] ............................................. H05K 7/20
[52] U.S. Cl. ..................... 361/386; 165/185; 174/16.3; 357/79; 357/81; 361/417; 361/419
[58] Field of Search ............................. 165/80.3, 185; 174/16.3; 357/81, 79; 361/386–389, 417, 419–420

[56] References Cited
U.S. PATENT DOCUMENTS
4,500,943 2/1985 Greene .................................. 361/383
4,667,270 5/1987 Yagi ..................................... 361/420

Primary Examiner—Gregory D. Thompson
Attorney, Agent, or Firm—Darby & Darby

[57] ABSTRACT

A retention clip for retaining a thermal protection sensor in contact with a ballast transformer core is disclosed which includes a vertical support engageable with a ballast housing for minimizing lateral movement, and a horizontal support, internal with the vertical support and engageable with the transformer laminations. A retaining bracket, integral with the vertical and horizontal supports, is provided which includes a channel defined by oppositely disposed shoulders and, such that a thermal protecton sensor is easily disposable therein. The retaining bracket is angled relative to the transformer and may be contactable with a removable cover for driving the sensor into contact with the core. The bracket is preferably composed of a resilient material for spring loading upon insertion, urging the thermal protection sensor into initimate contact with the transformer and thereby assuring optimum thermal protection over the transformer's life.

20 Claims, 5 Drawing Sheets

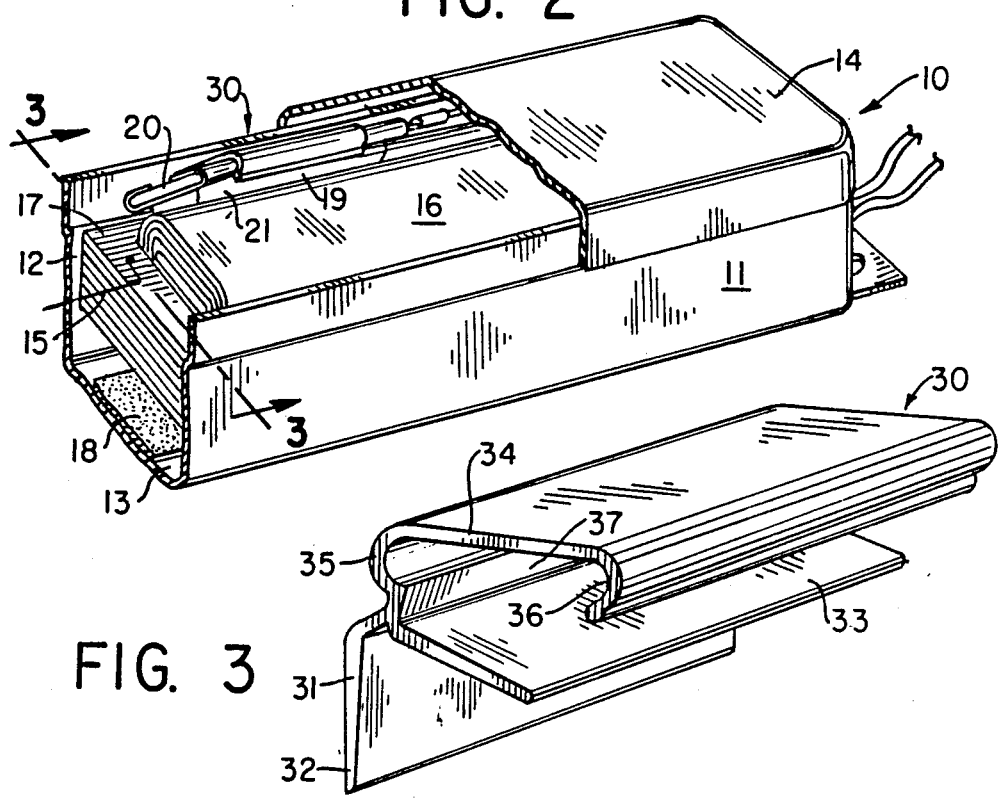
FIG. 2
FIG. 3
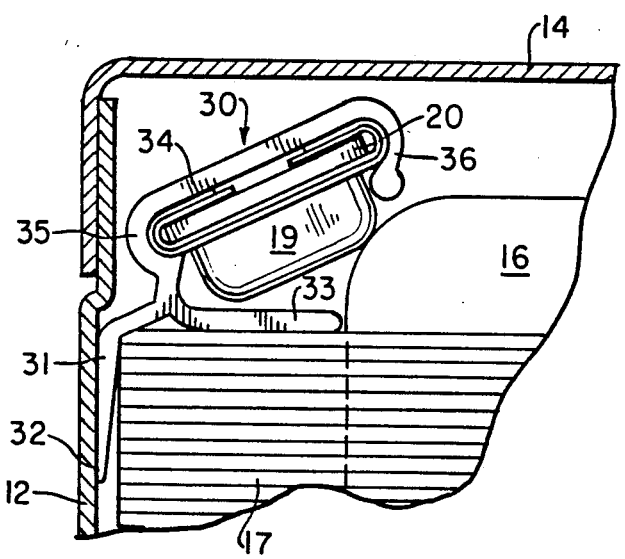
FIG. 3A

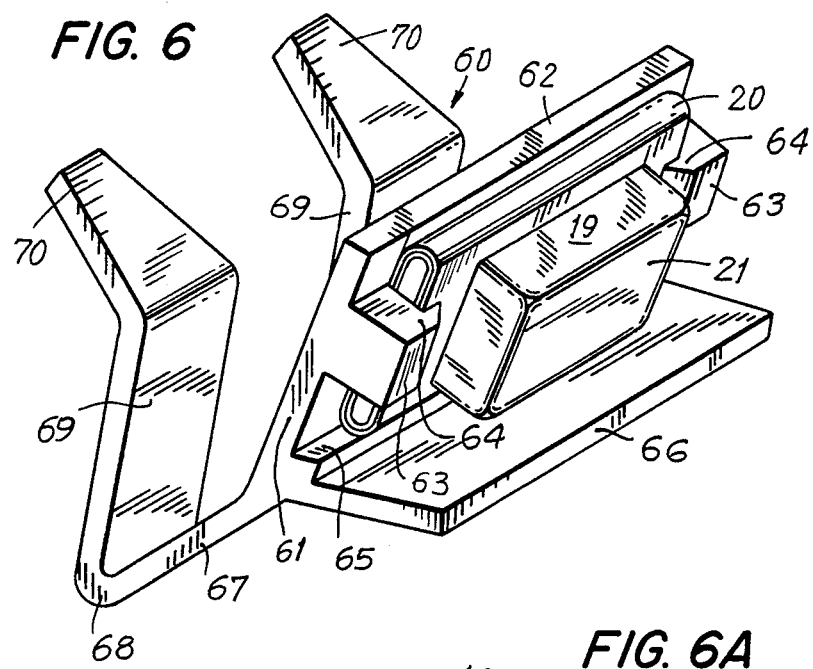
FIG. 6
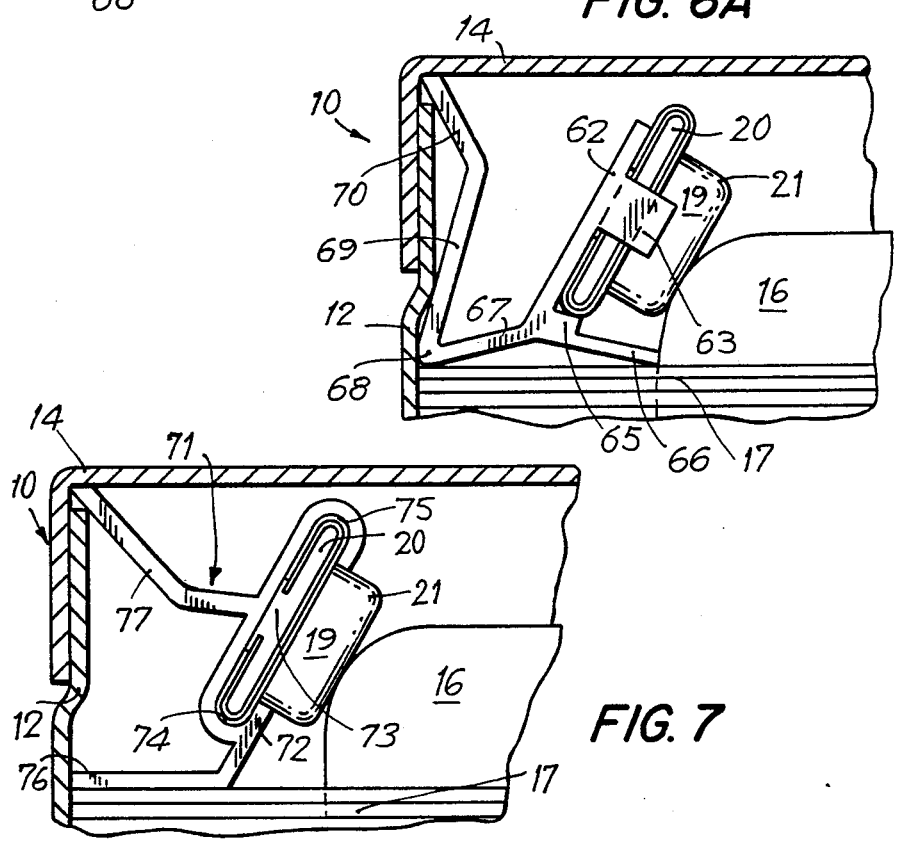
FIG. 6A
FIG. 7

RETENTION CLIP FOR A THERMAL PROTECTION SENSOR

TECHNICAL FIELD

This invention relates to retention clips for maintaining thermal protection sensors in contact with electrical devices such as inductors and transformer coils.

BACKGROUND OF THE INVENTION

Many electrical devices such as motors and transformers generate heat during operation. In some instances, due to overload, short-circuiting or other malfunctions, the devices may overheat to the point of destruction. In order to minimize damage when such overheating occurs, most electrical devices include thermal protection sensors which are usually wired into the operating circuit. These sensors monitor the operation of the device and interrupt the circuit if excessive temperatures are reached.

A typical use for such thermal protection sensors is in an electrical transformer, such as a ballast transformer in a fluorescent lighting fixture, to sense overheating and interrupt the power supply. Such transformers are usually disposed in a housing and insulated to protect the transformer by encasing in pitch. In order for a thermal protection sensor to work properly, it should be positioned in contact with a coil of the transformer and maintain that contact during the life of the device. Plastic clips are often used to hold the thermal protection sensor in the transformer housing, with the clip taped, glued or otherwise attached to the housing to prevent movement. An example of a typical prior art clip is shown in FIG. 1.

It has been found that the prior art clips do not provide uniformity in sensing as they rely on proximity rather than full contact with the electrical device. The sensor will vary in distance from the device, due to slight variations in the transformer coil configuration, sensor shape or housing dimensions. In addition, movement of the clip, either during transformer insulation or handling of the transformer, may similarly result in inconsistent sensing between devices. Therefore, it is desired to provide a clip which assures uniformity of contact, providing means for accurately positioning and maintaining contact during the life of the electrical device, thereby assuring optimum thermal protection.

SUMMARY OF THE INVENTION

It is an object of the present invention to provide a clip for a thermal protection sensor which positions and holds the thermal sensor in optimum contact with an electrical device.

It is a further object of the present invention to provide a clip for a thermal protection sensor which does not allow movement during insulation of the electrical device.

Another object is to provide a clip for a thermal protection sensor which is easily installed and economical to build. Such an object is essential where a large number of clips are required.

Accordingly, the present invention is directed to a clip for retaining a thermal protection sensor in contact with an electrical device, such as a transformer, disposed in a housing. The clip comprises a first wall engageable with a wall of the housing, for minimizing movement in one direction, for example, lateral movement. A second wall, integral with the first wall, is engageable with the electrical device, for minimizing movement in a second direction, for example, vertical movement. A retaining arm, which is integral with the first and/or second wall, includes a holder for retaining a thermal protection sensor therein, with the retaining arm disposed at an optimum angle relative to the device to insure optimum contact between the sensor and the electrical device. The arm may be engageable by a removable housing lid which, upon engagement, provides an urging force for maintaining the thermal protection sensor in contact with the device, or may be made from resilient material and designed for essentially spring loading the retaining arm upon insertion into the housing. This resiliency provides a compressively loaded clip for forcing the thermal protection sensor against the electrical device.

In a preferred embodiment of the present invention, the clip is designed for insertion into a housing containing a ballast transformer for fluorescent lamps. The inventive clip has as a first wall, a vertical support which includes a wedge portion insertable in a space between the transformer and the housing wall to firmly hold the clip within the housing. The second wall is a horizontal support which is integral with the vertical support and perpendicular thereto, with the horizontal support sitting atop a plurality of core laminations which are part of the transformer. The retaining arm, which is integral with the vertical and horizontal supports, extends from a junction therewith, and includes a channel defined by a pair of oppositely disposed shoulders, with the channel sized to retain a thermal protection sensor therein. The retaining arm, composed of a resilient material, extends at an optimum angle relative to the transformer to assure that the thermal protection sensor is in optimum contact with the device. The angle may be adjusted to assure compressive loading of the arm upon insertion. The retaining clip is therefore firmly positionable within the housing.

BRIEF DESCRIPTION OF THE DRAWINGS

FIG. 2 is an illustrative view of a transformer housing including an embodiment of the inventive retaining clip disposed therein.

FIG. 3 is a perspective view of the retaining clip shown in FIG. 2.

FIG. 3a is a cross sectional view of the housing, transformer and clip shown in FIG. 2, taken along the line 3—3.

FIGS. 6 and 6a shows another embodiment of the present invention, with FIG. 6a showing its mounting in a transformer housing.

FIG. 7 shows another embodiment of the inventive retaining clip.

DETAILED DESCRIPTION OF THE INVENTION

Figure 1:
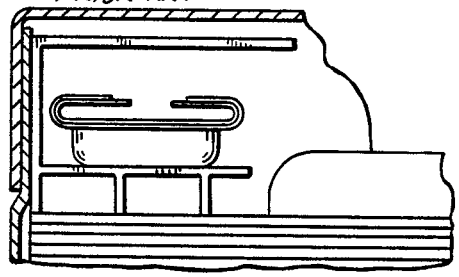
FIG. 1 is a side view of a prior art thermal protection sensor retaining clip.

Referring to FIG. 2, a typical ballast transformer arrangement is shown. A housing 10, which is usually composed of sheet metal of an appropriate size for the application, includes side walls 11 and 12, a bottom wall 13 and a removable cover 14. All of these pieces are of conventional construction.

A transformer 15 is located within the housing 10. One core 16 of the transformer 15 is enclosed within a stack of laminations 17. As seen, the upper part of the core 16 extends above the lamination stack, with the lower part adjacent to the bottom wall 13 of the housing. The core 16 is usually separated from the housing by an insulating strip 18 made of an insulating material, such as plastic or paper.

The temperature of the core 16 is sensed by a thermal protection sensor 19. The protection sensor can be of any suitable construction. For example, a Texas Instrument 7AM series thermal protector, which is a bimetallic snap action switch, may be used. The sensors are usually in a metal housing and require some type of insulation so that they do not come in contact with any current-carrying non-insulated portion of the transformer. The thermal protection sensor 19 is shown as having a flat base 20 on which is mounted the thermal protective package 21, this being of substantially rectangular shape, although any other shape can be used. The thermal package 21 includes the sensing and actuation devices for effecting a thermal cutout and is therefore to be maintained in continuous contact with the electrical device.

Referring to FIG. 3, an embodiment of the retaining clip of the present invention is shown. A clip 30 includes a vertical support 31 (i.e., the first wall) which includes a wedge 32, a horizontal support 33 (i.e., the second wall) and a protector retaining bracket or arm 34. The wedge portion 32, which may be tapered for ease of installation, is insertable between the laminations 17 and the housing wall 12, as shown in FIG. 3a. The retaining bracket 34 is at an angle relative to the transformer core 16 when the clip is inserted into its installed position. The bracket 34 includes a first shoulder 35 and a second shoulder 36 which define a channel 37 wherein the thermal protector sensor 19 is disposable. The clip may either be molded individually or extruded and cut from plastic. Suitable materials include, but are not limited to, propylene oxide, nylon, polypropylene, and ABS plastic.

Referring to FIG. 3a, the clip 30 is shown after insertion, with the horizontal support 33, which is essentially perpendicular to the vertical support 31, in contact with the top of the laminations 17. The thermal protection sensor 19 is disposed in the channel 37, with the shoulders 35 and 36 firmly and accurately positioning the thermal protection sensor against the core 16. It is preferred that the thermal protection sensor 19 be angled relative to the core to assure contact with the heat generating device. With retention clips made from a somewhat resilient material, the angle of the retaining arm can be determined such that the sensor contacts the core prior to full insertion of the clip, with full insertion essentially spring loading the bracket. This assures continued contact regardless of vibration or other disturbances. In addition, such a clip will accommodate a range of similar coil configurations, with the dimensional variations absorbed by the resilient bracket. Referring still to FIG. 3a, the bracket 34 is somewhat pivotal about a junction point 38, with the resiliency of the bracket urging the thermal protection sensor 19 into contact with the core 16.

Figure 4:
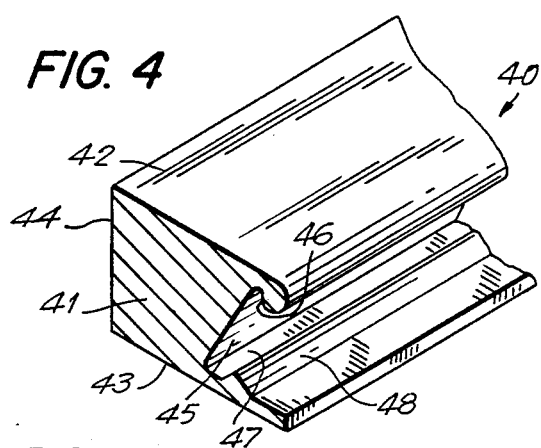
FIG. 4 is a perspective view of another embodiment of the retaining clip of the present invention.

Referring to FIG. 4, another embodiment of the retention clip is shown. A clip 40 comprises a block of electrical insulating material 41 having flat upper and lower faces 42 and 43, respectively, and one flat side face 44. The other side face includes a channel 45 defined by upper and lower inwardly turned lips 46 and 47 which are sized to accept the flat base 20 of the protector 19. Consequently, the protector 19 can be slid into the channel 45 and held therein. The channel 45 includes a conforming depression 48 adjacent the lower lip 47 which corresponds to the face of the protector package 21. Thus, when the protector 19 is slid into the channel 45, it is held by the two turned lips 46 and 47, with the package 21 resting on the depression 48. It is seen that the channel is angled so that the protector will be at an optimum angle relative to the core 16 and not parallel thereto.

Figure 4A:
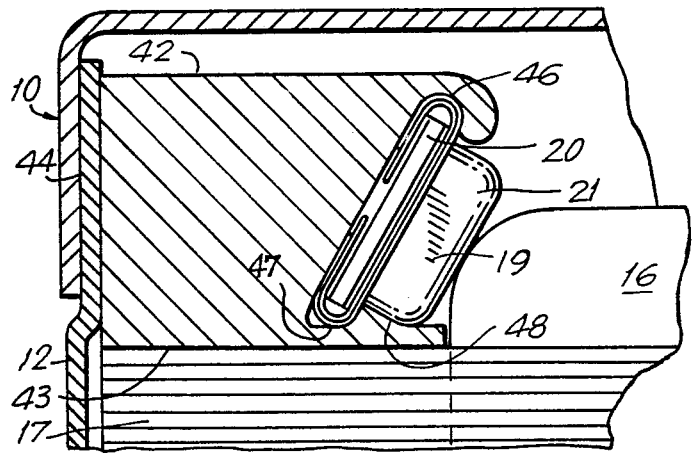
FIG. 4A shows the cross-section of a transformer housing, including the clip of FIG. 4 mounted therein.

Referring to FIG. 4a, the clip 40 with the protector 19 mounted therein is shown located in the ballast housing 10 for a fluorescent light fixture. The bottom face 43 of the block rests on the top of the laminations 17, with the side face 44 disposed against the side wall 12 of the housing 10. The clip 40 is sized so that the protector 19 is placed in contact with the transformer core 16.

Figure 5:
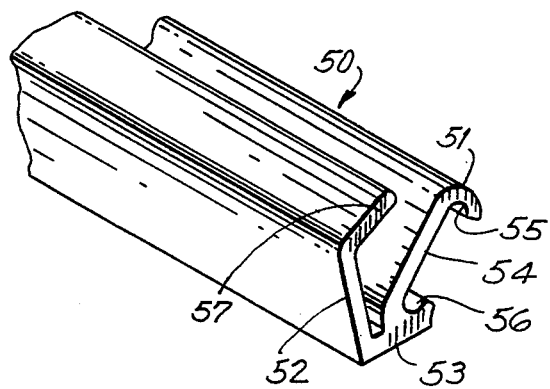
FIGS. 5 and 5A show another embodiment of the retaining clip with FIG. 5A showing its mounting in a transformer housing.
Figure 5A:
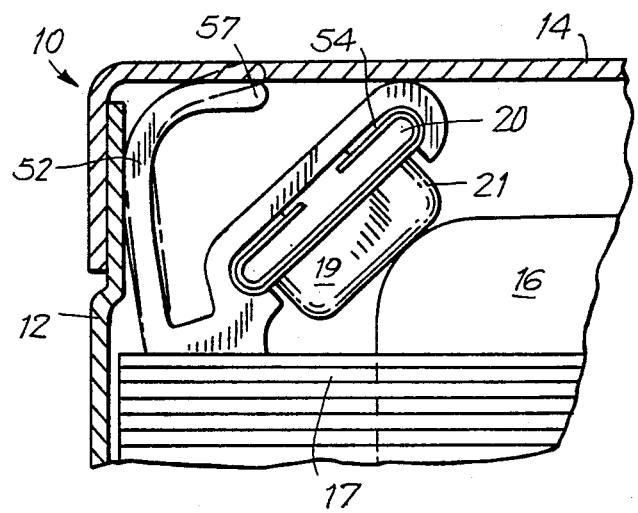

FIGS. 5 and 5A show another embodiment of the clip. Here, a clip 50, instead of comprising a block of solid material, is formed, preferably by extrusion, with a retaining arm 51 and a bracing arm 52, extending off of a flat bottom support 53. The retaining arm 51 is provided with a channel 54 which has a downwardly curved lip 55, and a complimentary upwardly curved lip 56, forming shoulders which are sized to retain the protector base 20 therein.

The arm 51 is optimally angled so that the sensor 19 is angled relative to the core 16 for optimal sensor effectiveness, with the support 53 seated on the laminations 17. The bracing arm 52 extends upwardly from the support 53, and further includes an engaging section 57 which extends from the upper end of the bracing arm, at an upward angle. The bracing arm is preferably resilient, and may further be concave relative to the housing wall 12 in a decree sufficient to exert a retaining force there-against upon insertion.

A typical mounting is shown in FIG. 5A. The thermal protector 19 is disposed in the channel 54 and is in contact with the core 16. The bracing arm 52 rests against the side wall 12 on the housing 10. When the cover 14 is placed on the housing, the cover contacts the engaging section 57, urging the bracing arm into firm contact with the housing wall 12 and the protector package 21 into intimate contact with the core 16. This holds the clip firmly within the housing.

FIG. 6 shows another embodiment for the inventive clip. A clip 60 includes a retaining arm 61 which has a wall 62 with two projecting bosses 63 extending perpendicular thereto and spaced apart by a distance corresponding generally to the length of the protector base 20. Each of the bosses 63 has a generally triangular latch 64 on its inner wall, with the latches in a facing relation. The thermal protection sensor 19 is pressed between the bosses 63 and retained by the latches 64, with the protector base 20 resting on a stop 65 which is integral with the wall 62 and a projecting member 66, which extends forwardly into contact with the core 16. The member 66 extends perpendicular to the wall 61 and joins with a base wall 67. The base wall 67 extends rearwardly to a transition curve 68, which sits atop the laminations 17.

The clip 60 also includes a pair of legs 69 which extend upwardly from the transition curve 68. Each of the legs 69 has an upper generally triangular mounting tab 70 which extends outwardly away from the retaining arm 61. The entire clip may be made of resilient material for essentially spring loading the protector on insertion.

Referring to FIG. 6A, the clip 60 is shown located within the housing 10, with the transition curve 68 and projecting member 66 wedged into the space between the transformer core 16 and the housing wall 12. Each of the tabs 70 is engaged by the housing cover 14, firmly wedging the clip within the housing. By slight adjustment of the transition curve angle, the tightness of the fit may be varied to accommodate the resiliency of the clip material. Thus, a spring loaded 3 point support is provided which insures that the sensor rests firmly against the core.

FIG. 7 shows a protector clip 71 which includes a retaining arm 72 having a channel 73 for retaining the protector 19 therein, with the channel defined by shoulders 74 and 75. The clip 71 further includes a resting wall 76 which sits atop the laminations 17, and a bracing leg 77, which, similar to the tabs 70 of FIG. 5, is engageable by the cover 14, firmly wedging the clip within the housing. Thus, the sensor is retained with only two point contact. It should be understood, however, that the resiliency of the bracing leg 77 provides more than adequate mounting force to assure uniform contact after engagement with the cover 14.

Figure 8:
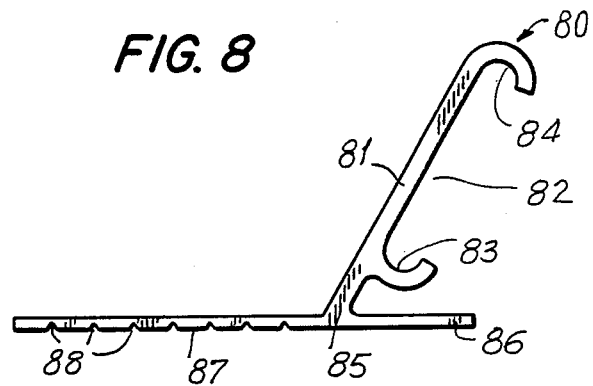
FIGS. 8 and 8a shows another embodiment of the present invention including an adjustable leg for accommodating various housing dimensions, with FIG. 8a showing its mounting in a transformer housing.
Figure 8A:
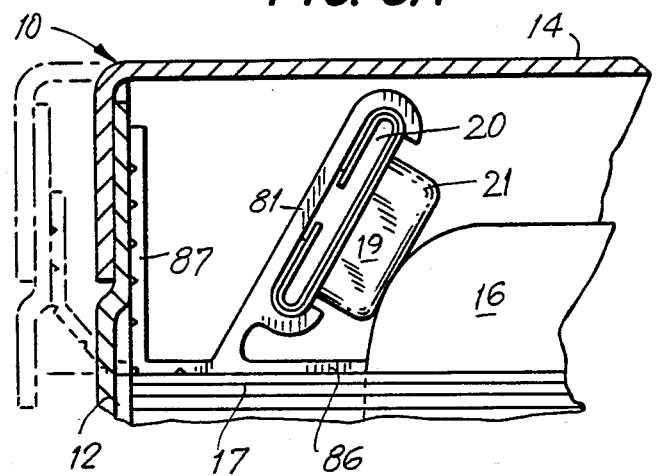

FIGS. 8 and 8A show another embodiment of the inventive clip, which may be made by plastic extrusion. Referring to FIG. 8, a clip 80 includes a retaining arm 81 which includes a channel 82 defined by oppositely disposed shoulders 83 and 84. Of course, the channel 82 is sized to retain the protection sensor 19 therein. The arm 81 extends from a base 85 at a chosen angle to assure optimum sensor contact. The base 85 includes a forward portion 86 which may extend into contact with the core 16. A rearward portion 87 extends towards the housing wall 12, with the portion 87 including a number of score lines 88 which provide for adjustably bending the base 85. Since the base 85 may be bent along any one of these score lines, the clip is easily adjustable for conforming to various housing and transformer dimensions.

FIG. 8A shows the clip 80 mounted in the housing 10. As seen, the base 85 is readily bent around one of the score lines 88 so that a section 87a extends upwardly and rests against the housing side wall 12. An exemplary position in a different size housing is shown in phantom, illustrating the adjustability of such a clip.

Figure 9:
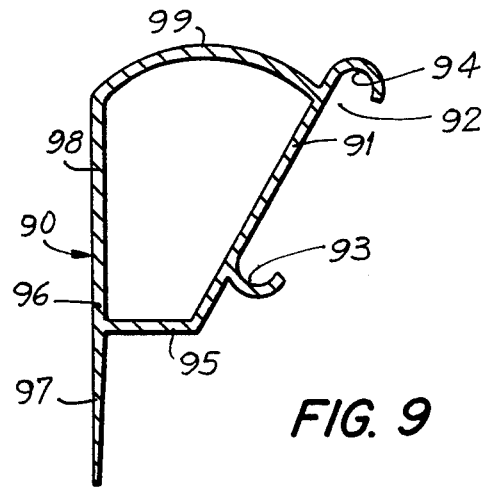
FIG. 9 shows another embodiment of the inventive retaining clip.

FIG. 9 shows another embodiment of the inventive clip, which may be made by extrusion. A clip 90 includes a retaining arm 91 having a channel 92 defined by shoulders 93 and 94. The retaining arm 91 is connected at its lower end to a base 95 which rests upon the laminates 17. The base is perpendicular to a vertical wall 96 which includes a lower wedge portion 97. The wedge portion 97 is insertable between the laminations 17 and the housing wall 12. An upper portion 98 of the vertical wall 96 extends to the top of the housing wall 12. A curved connecting wall 99 extends between the vertical wall 96 and the retaining arm 91, and is engageable by the cover 14. Upon insertion, the wedge portion 97 fits in the space between the laminations and the side wall 12, with the base resting on the laminates. The cover 14 is then attached, pressing down on the curved connecting wall 99, thereby driving the retaining arm 91, with the protector 19 disposed therein, into contact with the transformer core 16.

As is apparent from the above description, utilizing the inventive retention clip provides ease of insertion while assuring intimate contact between a thermal protection sensor and an electrical device regardless of dimensional variations. In addition, such clips prevent movement during insulation or handling as they are fairly well wedged into position, with some utilizing resilient material and structures for urging continuous contact over the life of the device. The inventive clip is easily insertable into the ballast housing, without requiring gluing, taping or other attachment means, while providing continuous engagement of a thermal protection sensor with the ballast transformer. Such a clip is also easily manufactured in bulk from plastic by extrusion, molding or other means, thereby assuring accurate sensor positioning at a minimum cost. It should be understood by those skilled in the art that the invention is not limited to the particular embodiment shown and described, but that various changes and modifications may be made without departing from the scope of the present invention.

Having thus described the invention, we claim:

1. A clip for retaining a thermal protection sensor, with the clip adapted to be disposed in a housing having an electrical device with a heat generating portion, with the clip placing and maintaining the thermal protection sensor firmly in contact with the heat generating portion of the electrical device, the clip comprising:
   first wall means for engaging a wall of the housing;
   second wall means, integral with the first wall means, for engaging the electrical device; and,
   a thermal protection sensor retaining arm, integral with one of the first or second wall means, the arm including holding means for engaging the thermal protection sensor, the arm being disposed at an angle relative to the electrical device such that the thermal protection sensor is held in intimate contact with the electrical device.

2. The clip of claim 1 wherein the first wall means extends parallel to the housing wall, with the second wall means, having a substantially horizontal flat surface perpendicular to the first wall means.

3. The clip of claim 2 wherein the first wall means has an upper portion extending above the flat surface, and a lower portion extending below the second flat surface wall means, with the lower portion forming a wedge which is disposable between an end of the device and the housing wall.

4. The clip of claim 3 wherein the wedge has a tapered end.

5. The clip of claim 1 wherein the first wall means is a wedge which is adapted to be disposed between the device and the housing.

6. The clip of claim 2 further comprising an upwardly curved connecting wall which extends from the first wall means to the retaining arm, with the curved wall being engageable by a housing cover for maintaining the thermal protection sensor in intimate contact with the device.

7. The clip of claim 1 wherein the first wall means comprises a curved wall.

8. The clip of claim 1 wherein the second wall means comprises a curved wall.

9. The clip of claim 1 wherein the second wall means comprises a forward portion which extends into contact with the device, and a rearward portion, the rearward portion being bendable into a position essentially perpendicular to the forward portion, at an optimum distance from the device, the bent portion thereafter comprising the first wall means.

10. The clip of claim 1 wherein the retaining arm holding means comprise facing curved shoulders, integral with the arm, and spaced apart in an amount sufficient to allow insertion of a thermal protection sensor therein.

11. The clip of claim 1 wherein the retaining arm holding means comprise a pair of protective bosses extending perpendicular to the retaining arm and spaced apart in an amount essentially corresponding to the size of a base of the sensor, each boss further including a latch with the latches in a facing relation and being extendable over the sensor base.

12. The clip of claim 1 further comprising cover engagement means for maintaining the thermal protection sensor in intimate contact with the device urging the retaining arm into intimate contact with the device.

13. The clip of claim 11 wherein the cover engagement means comprises a wall portion which extends from an upper end of the first wall means at an upward angle such that the wall portion is driven downwardly by the cover, urging positive positioning of the first wall means against the housing wall.

14. The clip of claim 1 wherein the clip is composed of a resilient material.

15. The clip of claim 1 wherein the clip is composed of plastic.

16. The clip of claim 1 wherein the electrical device is a transformer including a core surrounded by laminates.

17. The clip of claim 1 wherein the clip is a solid block, having a flat upper face, flat lower face, a flat side face.

18. The clip of claim 1 wherein the clip includes a transition curve at a junction between the first and second wall means, with the second wall means including a base wall extending from the curve to the retaining arm, and a projecting member extending forwardly from the base wall into contact with the device.

19. The clip of claim 1 wherein the first wall means include a pair of legs extending substantially upwardly, the legs further including a pair of tabs at a top end thereof, which extend towards the housing wall.

20. The clip of claim 15 wherein the plastic is from the group consisting essentially of nylon, polypropylene and ABS plastic.

* * * * *